(12) United States Patent
Kitahara et al.

(10) Patent No.: US 11,355,408 B2
(45) Date of Patent: Jun. 7, 2022

(54) METHOD OF MANUFACTURING INSULATING CIRCUIT BOARD WITH HEATSINK

(71) Applicant: MITSUBISHI MATERIALS CORPORATION, Tokyo (JP)

(72) Inventors: Takeshi Kitahara, Hitachinaka (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 98 days.

(21) Appl. No.: 16/980,054

(22) PCT Filed: Mar. 26, 2019

(86) PCT No.: PCT/JP2019/012703
§ 371 (c)(1),
(2) Date: Sep. 11, 2020

(87) PCT Pub. No.: WO2019/189090
PCT Pub. Date: Oct. 3, 2019

(65) Prior Publication Data
US 2021/0020536 A1 Jan. 21, 2021

(30) Foreign Application Priority Data
Mar. 27, 2018 (JP) .............................. JP2018-059917

(51) Int. Cl.
*H01L 23/36* (2006.01)
*H01L 23/14* (2006.01)

(52) U.S. Cl.
CPC ............ *H01L 23/36* (2013.01); *H01L 23/142* (2013.01); *H01L 2924/14* (2013.01)

(58) Field of Classification Search
CPC ... C04B 37/021; H01L 21/4882; H01L 23/12; H01L 23/142; H01L 23/36; H01L 23/367; H01L 23/3735; H01L 23/3736
See application file for complete search history.

(56) References Cited

U.S. PATENT DOCUMENTS 6,033,787 A 3/2000 Nagase et al.
2007/0274047 A1* 11/2007 Nagase .............. H01L 23/3735
29/851

(Continued)

FOREIGN PATENT DOCUMENTS

JP 10-270596 A 10/1998
JP 2000-281468 A 10/2000
(Continued)

OTHER PUBLICATIONS

Supplementary European Search Report dated Dec. 7, 2021, issued for European Patent Application No. 19777648.7.
(Continued)

*Primary Examiner* — Allan R Wilson
(74) *Attorney, Agent, or Firm* — Locke Lord LLP (57) ABSTRACT

What is provided is a method of manufacturing an insulating circuit board with a heatsink including an insulating circuit board and a heatsink, the heatsink being bonded to the metal layer side of the insulating circuit board, the metal layer being formed of aluminum, and a bonding surface of the heatsink with the insulating circuit board being formed of an aluminum alloy having a solidus temperature of 650° C. or lower. This method includes a high alloy element concentration portion forming step (S02) of forming a high alloy element concentration portion and a heatsink bonding step (S03) of bonding the heatsink, in which a ratio tb/ta of a (Continued)

thickness tb of the brazing material layer to a thickness to of the core material in the clad material is in a range of 0.1 to 0.3.

8 Claims, 9 Drawing Sheets

(56) References Cited

U.S. PATENT DOCUMENTS

| | | | |
|---|---|---|---|
| 2010/0258233 A1* | 10/2010 | Tonomura | H05K 1/0306 |
| | | | 264/642 |
| 2017/0053852 A1 | 2/2017 | Oi et al. | |
| 2017/0271237 A1* | 9/2017 | Terasaki | H01L 23/3735 |
| 2021/0134609 A1 | 5/2021 | Yumoto et al. | |

FOREIGN PATENT DOCUMENTS

| | | |
|---|---|---|
| JP | 3171234 B2 | 5/2001 |
| JP | 2014-060215 A | 4/2014 |
| JP | 2015-216370 A | 12/2015 |
| JP | 2016-041434 A | 3/2016 |
| JP | 2018-046265 A | 3/2018 |
| WO | 2018/180159 A1 | 10/2018 |

OTHER PUBLICATIONS

International Search Report dated Jun. 11, 2019, issued for PCT/JP2019/012703 and English translation thereof.

* cited by examiner

METHOD OF MANUFACTURING INSULATING CIRCUIT BOARD WITH HEATSINK

TECHNICAL FIELD

The present invention relates to a method of manufacturing an insulating circuit board with a heatsink including an insulating circuit board and a heatsink, the insulating circuit board including a circuit layer that is formed on a first surface of an insulating layer and a metal layer that is formed on a second surface of the insulating layer, and the heatsink being bonded to the metal layer side of the insulating circuit board.

Priority is claimed on Japanese Patent Application No. 2018-059917, filed on Mar. 27, 2018, the content of which is incorporated herein by reference.

BACKGROUND ART

A power module, a LED module, or a thermoelectric module has a structure in which a power semiconductor element, a LED element, and a thermoelectric element is bonded to an insulating circuit board in which a circuit layer formed of a conductive material is formed on a first surface of an insulating layer.

For example, in a power semiconductor element for high power control that is used for controlling wind power generation, an electric vehicle, a hybrid vehicle, or the like, the amount of heat generated during an operation is large. As a substrate on which the power semiconductor element is mounted, for example, an insulating circuit board is widely used in the related art, the insulating circuit board including: a ceramic substrate that is formed of aluminum nitride, silicon nitride, or the like; and a circuit layer that is formed by bonding a metal sheet having excellent conductivity to a first surface of the ceramic substrate. As the insulating circuit board, an insulating circuit board including a metal layer that is formed by bonding a metal sheet to a second surface of the ceramic substrate is also provided.

For example, Patent Document 1 discloses an insulating circuit board including a circuit layer and a metal layer that are formed on a first surface and a second surface of a ceramic substrate, respectively, using an aluminum sheet or a copper sheet.

A heatsink is bonded to the second surface side of the insulating circuit board such that heat transmitted from a semiconductor element to the insulating circuit board side is dissipated to the outside via the heatsink.

As a material of the heatsink, an aluminum alloy or an aluminum material such as an aluminum-based composite material in which a silicon carbide member represented by AlSiC disclosed in Patent Document 2 is filled with aluminum or an aluminum alloy is widely used.

When the heatsink is formed of an aluminum alloy having a low solidus temperature, the heatsink can be formed in a shape having a relatively complex structure, and heat radiation can be improved. In addition, when the heatsink is formed of an aluminum-based composite material in which a silicon carbide member is filled with aluminum or an aluminum alloy, the thermal expansion coefficient is close to that of the insulating circuit board such that a thermal strain during loading of a thermal cycle can be suppressed to be low.

As means for bonding a metal layer formed of aluminum and a heatsink formed of an aluminum material to each other, for example, Patent Document 3 discloses a method of providing a bonding material formed of copper or a copper alloy between a metal layer formed of aluminum and a heatsink and bonding the metal layer and the bonding material to each other and bonding the bonding material and the heatsink to each other by solid phase diffusion bonding.

CITATION LIST

Patent Literature

[Patent Document 1]
  Japanese Patent No. 3171234
[Patent Document 2]
  Japanese Unexamined Patent Application, First Publication No. 2000-281468
[Patent Document 3]
  Japanese Unexamined Patent Application, First Publication No. 2014-060215

SUMMARY OF INVENTION

Technical Problem

However, recently, the size and thickness of a power module have been reduced, and the usage environment thereof has also become stricter. Therefore, the amount of heat generated from a semiconductor element has increased, conditions of a thermal cycle have become stricter, and an insulating circuit board with a heatsink having excellent bonding reliability and excellent heat radiation as compared to the related art has been required.

In the insulating circuit board, the metal layer is formed of a metal having a relatively low deformation resistance, for example, aluminum (4N aluminum) having a purity of 99.99 mass % or higher such that a thermal strain during loading of a thermal cycle is absorbed by deformation of the metal layer and the cracking or the like of the insulating layer can be suppressed.

When the metal layer is formed of 4N aluminum, a bonding surface of the heatsink is formed of an aluminum alloy such as ADC12, and the metal layer and the bonding surface of the heatsink are bonded to each other by solid phase diffusion bonding using the method described in PTL 3, there is a large difference in solidus temperature between the metal layer and the bonding surface of the heatsink. Therefore, it is necessary that a temperature condition during solid phase diffusion bonding is lower than the solidus temperature of the aluminum alloy. In addition, in 4N aluminum having a high purity, the diffusion activation energy is high, and a diffusion phenomenon is not likely to occur. Therefore, solid phase diffusion between Al of the metal layer formed of 4N aluminum having a high solidus temperature and Cu of the bonding material is insufficient, and bonding reliability between the metal layer and the heatsink may deteriorate.

The present invention has been made in consideration of the above-described circumstances, and an object thereof is to provide a method of manufacturing an insulating circuit board with a heatsink in which a metal layer and a heatsink can be reliably bonded to each other by solid phase diffusion bonding even when the metal layer is formed of aluminum having a relatively low deformation resistance and a bonding surface of the heatsink is formed of an aluminum alloy having a relatively low solidus temperature.

Solution to Problem

In order to solve the above-described problems and to achieve the object, according to the present invention, there is provided a method of manufacturing an insulating circuit board with a heatsink including an insulating circuit board and a heatsink, the insulating circuit board including a circuit layer that is formed on a first surface of an insulating layer and a metal layer that is formed on a second surface of the insulating layer, the heatsink being bonded to the metal layer side of the insulating circuit board, the metal layer being formed of aluminum and having a configuration in which an indentation hardness of a thickness center portion is lower than 50 mgf/μm², a bonding surface of the heatsink with the insulating circuit board being formed of an aluminum alloy having a solidus temperature of 650° C. or lower, and the method including: a high alloy element concentration portion forming step of forming a high alloy element concentration portion having a higher alloy element concentration than the thickness center portion of the metal layer and having a solidus temperature of 650° C. or lower by laminating a clad material including a core material and a brazing material layer formed on both surfaces of the core material on a region of the metal layer opposite to the insulating layer to obtain a laminate and heating the laminate to diffuse an alloy element of the brazing material layer; and a heatsink bonding step of bonding the heatsink to the metal layer by laminating a copper bonding material formed of copper or a copper alloy between the metal layer and a bonding surface of the heatsink and bonding the metal layer and the copper bonding material to each other and bonding the copper bonding material and the heatsink to each other by solid phase diffusion bonding, in which a ratio tb/ta of a thickness tb of the brazing material layer to a thickness to of the core material in the clad material is in a range of 0.1 to 0.3.

The method of manufacturing an insulating circuit board with a heatsink having the above-described configuration includes: a high alloy element concentration portion forming step of forming a high alloy element concentration portion having a higher alloy element concentration than a thickness center portion of the metal layer and having a solidus temperature of 650° C. or lower in a region of the metal layer opposite to the insulating layer; and a heatsink bonding step of bonding the heatsink to the metal layer by laminating a copper bonding material formed of copper or a copper alloy between the metal layer and a bonding surface of the heatsink and bonding the metal layer and the copper bonding material to each other and bonding the copper bonding material and the heatsink to each other by solid phase diffusion bonding. Therefore, a temperature difference between the solidus temperature of the high alloy element concentration portion of the metal layer and the solidus temperature of the aluminum alloy forming the bonding surface of the heatsink can be reduced, even when solid phase diffusion bonding is performed under a relatively low-temperature condition, Al of the metal layer (the high alloy element concentration portion) and Cu of the copper bonding material can be sufficiently diffused and Cu of the copper bonding material and Al of the bonding surface of the heatsink can be sufficiently diffused, and the insulating circuit board and the heatsink can be reliably bonded to each other.

In addition, the metal layer is formed of aluminum, in which the indentation hardness of the thickness center portion is lower than 50 mgf/μm². Therefore, during loading of a thermal cycle on the insulating circuit board with a heatsink, a thermal strain can be released by deforming the metal layer, and the cracking or the like of the insulating layer can be suppressed.

Further, the bonding surface of the heatsink is formed of an aluminum alloy having a solidus temperature of 650° C. or lower. Therefore, a heatsink suitable for required performance can be configured.

Further, in the high alloy element concentration portion forming step, the clad material including a core material and a brazing material layer formed on both surfaces of the core material is laminated on a region of the metal layer opposite to the insulating layer to obtain a laminate, and the laminate is heated to diffuse an alloy element of the brazing material layer. As a result, the high alloy element concentration portion having a higher alloy element concentration than the thickness center portion of the metal layer and having a solidus temperature of 650° C. or lower can be formed in the region of the metal layer opposite to the insulating layer.

By adjusting heating conditions to control the diffused state of the alloy element, a high alloy element concentration portion having a predetermined thickness can be formed.

In addition, the ratio tb/ta of the thickness tb of the brazing material layer to the thickness to of the core material in the clad material is set to be in a range of 0.1 to 0.3. Therefore, the high alloy element concentration portion having a higher alloy element concentration than the thickness center portion of the metal layer and having a solidus temperature of 650° C. or lower can be reliably formed in the region of the metal layer opposite to the insulating layer.

In the method of manufacturing an insulating circuit board with a heatsink according to the present invention, it is preferable that in the high alloy element concentration portion, a Si concentration is in a range of 2.0 mass % to 7.0 mass %, and an Mn concentration is in a range of 0.3 mass % to 1.5 mass %. Therefore, a temperature difference between the solidus temperature of the high alloy element concentration portion of the metal layer and the solidus temperature of the aluminum alloy forming the bonding surface of the heatsink can be reliably reduced, and even when solid phase diffusion bonding is performed under a relatively low-temperature condition, the insulating circuit board and the heatsink can be reliably bonded to each other.

In addition, in the method of manufacturing an insulating circuit board with a heatsink according to the present invention, it is preferable that the high alloy element concentration portion forming step is performed at the same time as a metal layer forming step of forming the metal layer on the insulating layer.

In this case, by performing the high alloy element concentration portion forming step at the same time as the metal layer forming step of forming the metal layer on the insulating layer, the insulating circuit board with a heatsink can be efficiently manufactured with a reduced number of manufacturing steps. In addition, a thermal load on the insulating layer can be reduced, and deterioration of the insulating layer can be suppressed.

Further, in the method of manufacturing an insulating circuit board with a heatsink according to the present invention, the circuit layer may include an aluminum layer that is formed on the insulating layer side and a copper layer that is laminated on the aluminum layer, a second high alloy element concentration portion having a higher alloy element concentration than a thickness center portion of the aluminum layer and a solidus temperature of 650° C. or lower may be formed in a region of the aluminum layer opposite to the insulating layer, and the high alloy element concentration portion and the second high alloy element concentration portion may be formed in the high alloy element concentration portion forming step.

In this case, the circuit layer has the structure in which the aluminum layer and the copper layer are laminated. Therefore, heat in a heating element mounted on the circuit layer can be spread in the copper layer in a plane direction, and an insulating circuit board with a heatsink having excellent heat radiation can be manufactured.

In addition, the second high alloy element concentration portion is formed between the aluminum layer and the copper layer. Therefore, a temperature difference between the solidus temperature of the high alloy element concentration portion and the second high alloy element concentration portion and the solidus temperature of aluminum or the aluminum alloy forming the bonding surface of the heatsink can be reduced, even when solid phase diffusion bonding is performed under a relatively low-temperature condition, Al of the metal layer (the high alloy element concentration portion) and Cu of the copper bonding material can be sufficiently diffused, Cu of the copper bonding material and Al of the bonding surface of the heatsink can be sufficiently diffused, and Al of the aluminum layer (the second high alloy element concentration portion) and Cu of the copper layer can be sufficiently diffused, the insulating circuit board and the heatsink can be reliably bonded to each other, and the circuit layer in which the aluminum layer and the copper layer are laminated can be formed.

Advantageous Effects of Invention

The present invention can provide a method of manufacturing an insulating circuit board with a heatsink in which a metal layer and a heatsink can be reliably bonded to each other by solid phase diffusion bonding even when the metal layer is formed of aluminum having a relatively low deformation resistance and a bonding surface of the heatsink is formed of an aluminum alloy having a relatively low solidus temperature.

DESCRIPTION OF EMBODIMENTS

Hereinafter, an embodiment of the present invention will be described with reference to the accompanying drawings.

Figure 1:
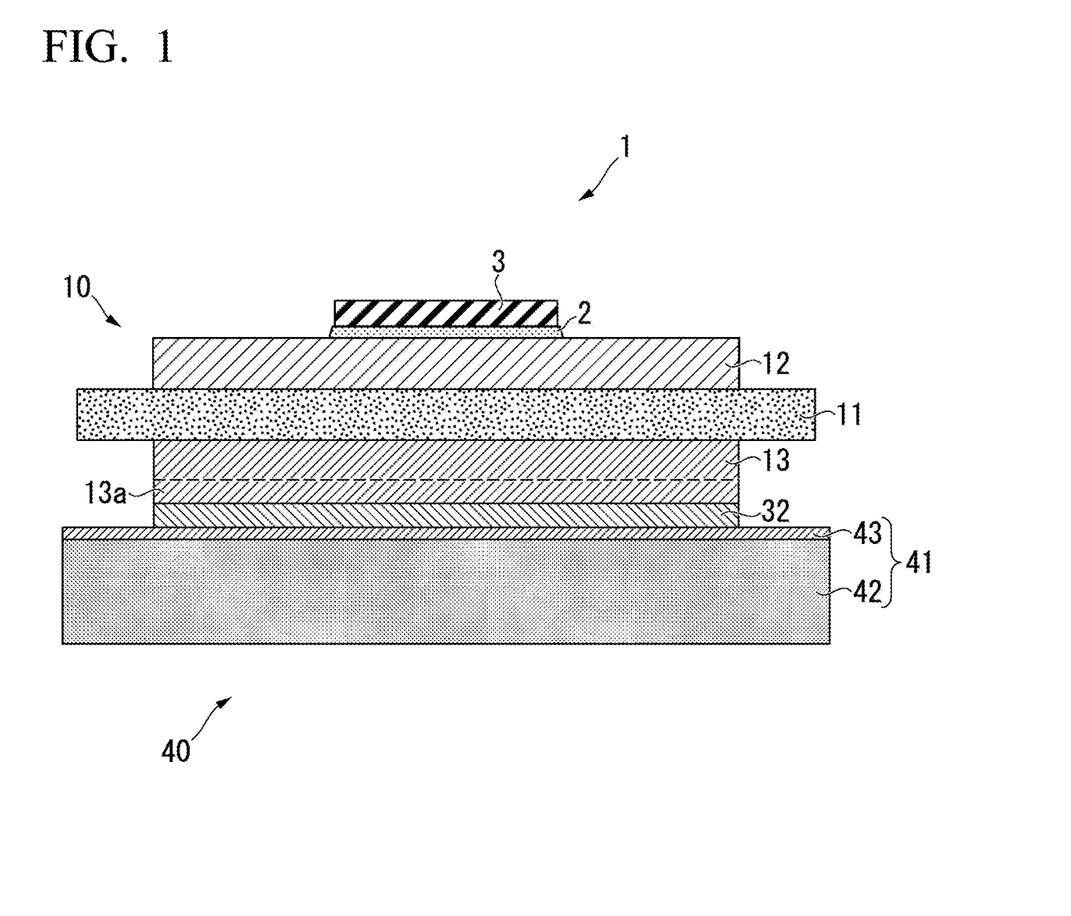
FIG. 1 is a schematic diagram illustrating a power module including an insulating circuit board with a heatsink that is manufactured using a method of manufacturing an insulating circuit board with a heatsink according to an embodiment of the present invention.

FIG. 1 illustrates an insulating circuit board with a heatsink 40 manufactured using a method of manufacturing an insulating circuit board with a heatsink according to the embodiment of the present invention and a power module 1 in which the insulating circuit board with a heatsink 40 is used.

The power module 1 illustrated in FIG. 1 includes: an insulating circuit board 10; a semiconductor element 3 that is bonded to a first surface (in FIG. 1, an upper surface) of the insulating circuit board 10 via a solder layer 2; and a heatsink 41 that is bonded to a lower side of the insulating circuit board 10. The insulating circuit board 10 to which the heatsink 41 is bonded is the insulating circuit board with a heatsink 40 according to the embodiment.

The semiconductor element 3 is formed of a semiconductor material such as Si. The solder layer 2 via the insulating circuit board 10 and the semiconductor element 3 are bonded is formed of, for example, a Sn—Ag solder material, a Sn—Cu solder material, a Sn—In solder material, or a Sn—Ag—Cu solder material (so-called lead-free solder material).

As illustrated in FIG. 1, the insulating circuit board 10 includes: a ceramic substrate 11 that is an insulating layer; a circuit layer 12 that is provided on a first surface (in FIG. 1, an upper surface) of the ceramic substrate 11; and a metal layer 13 that is formed on a second surface (in FIG. 1, a lower surface) of the ceramic substrate 11.

The ceramic substrate 11 prevents electrical connection between the circuit layer 12 and the metal layer 13 and may be formed of aluminum nitride (AlN), silicon nitride ($Si_3N_4$), or alumina ($Al_2O_3$) having high insulating properties. In the embodiment, the ceramic substrate 11 is formed of aluminum nitride. The thickness of the ceramic substrate 11 is set to be in a range of 0.2 mm to 1.5 mm and, in the embodiment, may set to 0.635 mm.

Figure 5:
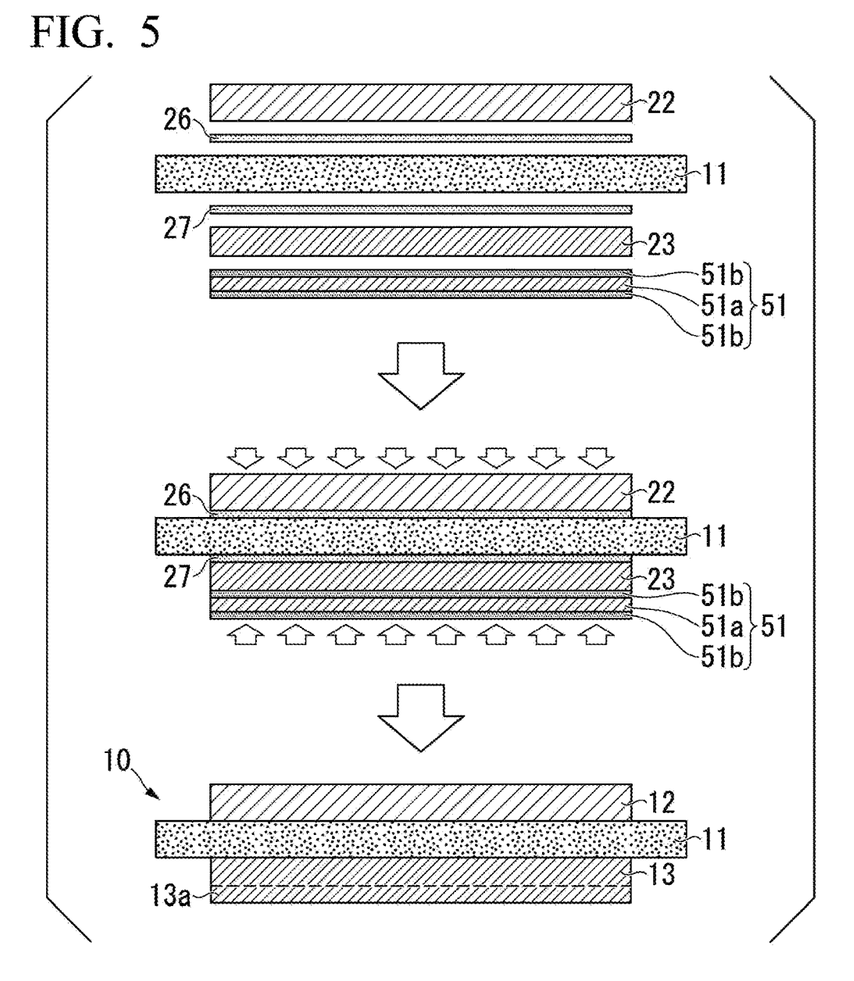
FIG. 5 is a diagram illustrating the method of manufacturing an insulating circuit board with a heatsink according to the embodiment of the present invention.

The circuit layer 12 is formed by bonding a metal sheet having conductivity to the first surface of the ceramic substrate 11. In the embodiment, as illustrated in FIG. 5, the circuit layer 12 is formed by bonding an aluminum sheet 22 formed of aluminum or an aluminum alloy. Specifically, as the aluminum sheet 22 forming the circuit layer 12, a rolled sheet of aluminum (2N aluminum) having a purity of 99 mass % or higher or an aluminum alloy such as A3003 or A6063 is used.

A circuit pattern is formed on the circuit layer 12, and a first surface (in FIG. 1, an upper surface) of the circuit layer 12 is a mounting surface on which the semiconductor element 3 is mounted. The thickness of the circuit layer 12 is set to be in a range of 0.1 mm to 2.0 mm and, in the embodiment, is set to 0.4 mm.

As illustrated in FIG. 5, the metal layer 13 is formed by bonding an aluminum sheet 23 formed of aluminum to the second surface of the ceramic substrate 11, laminating a clad material 51 on the second surface of the aluminum sheet 23, and heating the laminate.

The indentation hardness in a thickness center portion of the metal layer 13 is lower than 50 mgf/$\mu$m$^2$. The indentation hardness is a value of the insulating circuit board with a heatsink 40 at 25° C.

As the aluminum sheet 23 forming the metal layer 13, for example, aluminum (2N aluminum) having a purity of 99 mass % or higher, aluminum (3N aluminum) having a purity of 99.9 mass % or higher, or aluminum (4N aluminum) having a purity of 99.99 mass % or higher can be used.

In the embodiment, a rolled sheet of aluminum (4N aluminum) having a purity of 99.99 mass % or higher is used as the aluminum sheet 23 forming the metal layer 13.

Figure 2:
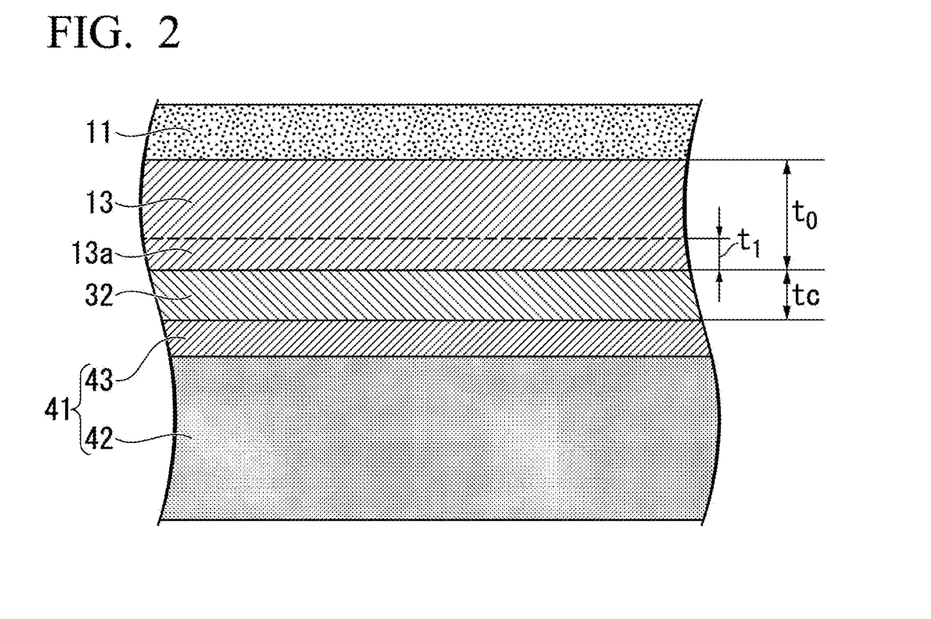
FIG. 2 is an enlarged diagram illustrating a bonded interface between a metal layer and a heatsink in the insulating circuit board with a heatsink illustrated in FIG. 1.

As illustrated in FIG. 2, a thickness t0 of the metal layer 13 is set to be in a range of 0.2 mm to 1.0 mm and, in the embodiment, is set to 0.4 mm.

In the embodiment, a high alloy element concentration portion 13a having a higher alloy element concentration than a thickness center portion of the metal layer 13 and having a solidus temperature of 650° C. or lower is formed in a region of the metal layer 13 opposite to the ceramic substrate 11.

That is, in the metal layer 13 according to the embodiment, an alloy element concentration distribution is present in a thickness direction.

As the alloy elements, Si, Mn, and the like are preferably used. In the embodiment, the high alloy element concentration portion 13a is a region including Si and Mn as the alloy elements, in which a Si concentration is in a range of 2.0 mass % to 7.0 mass % and an Mn concentration is in a range of 0.3 mass % to 1.5 mass %.

In addition, a thickness t1 of the high alloy element concentration portion 13a is preferably in a range of 0.05 mm to 0.3 mm.

The heatsink 41 is provided to cool the insulating circuit board 10 and, in the embodiment, is a radiating sheet formed of a material having excellent thermal conductivity as illustrated in FIG. 1.

In the embodiment, the heatsink 41 is formed of an Al—SiC composite material (so-called AlSiC) of a porous body formed of SiC and an aluminum material formed of an aluminum alloy impregnated into the porous body. In the embodiment, as the aluminum material to be impregnated into the porous body formed of SiC, ADC12 (solidus temperature: 570° C.) is used.

Figure 3:
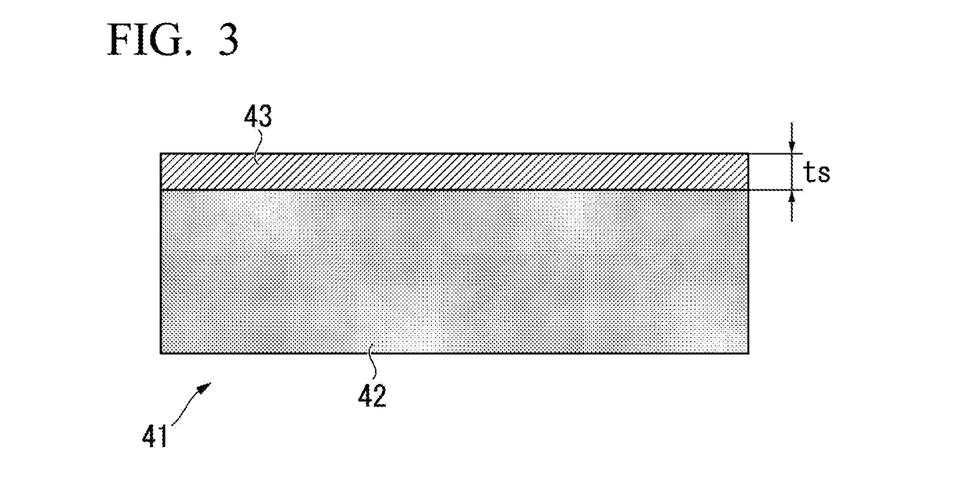
FIG. 3 is a schematic diagram illustrating the heatsink used in the insulating circuit board with a heatsink illustrated in FIG. 1.

In addition, in the embodiment, in the heatsink 41, as illustrated in FIG. 3, a skin layer 43 formed of an aluminum material (in the embodiment, ADC12) impregnated into a porous body is formed on a surface of a heatsink main body 42 formed of AlSiC.

In the embodiment, the thickness of the heatsink main body 42 is set to be in a range of 0.5 mm to 5.0 mm, and a thickness is of a skin layer 43 is preferably 0.01 times to 0.1 times the thickness of the heatsink main body 42.

A temperature difference between the solidus temperature of the high alloy element concentration portion 13a and the solidus temperature of the aluminum alloy forming the bonding surface (in the embodiment, the skin layer 43) of the heatsink 41 is in a range of 80° C. or lower.

The metal layer 13 of the insulating circuit board 10 and the heatsink 41 are bonded to each other via a copper bonding layer 32.

Figure 7:
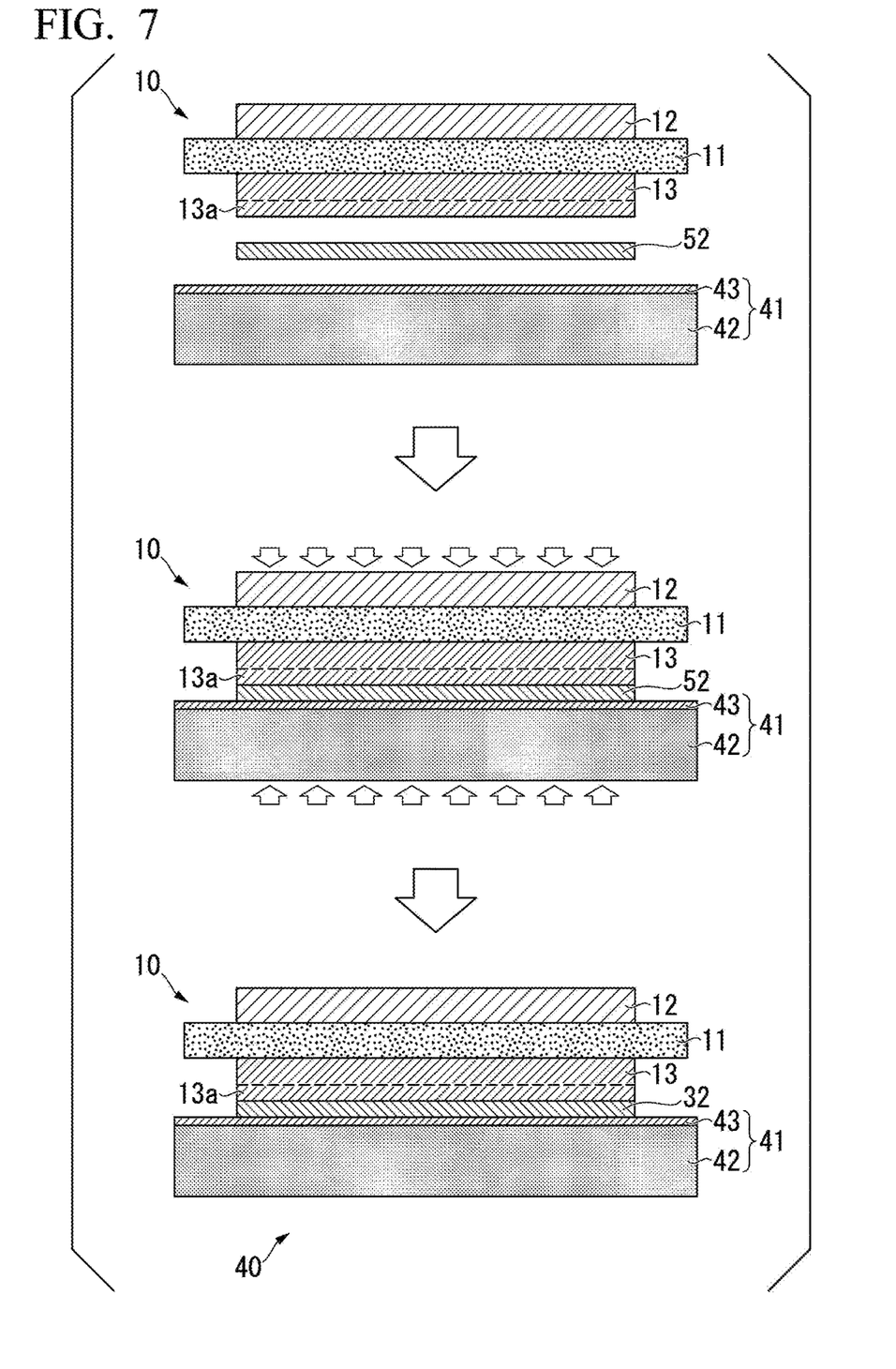
FIG. 7 is a diagram illustrating the method of manufacturing an insulating circuit board with a heatsink according to the embodiment of the present invention.

The copper bonding layer 32 is formed of copper or a copper alloy. In the embodiment, as illustrated in FIG. 7, the copper bonding layer 32 is formed by bonding a copper sheet 52 formed of a rolled sheet of oxygen free copper. In the embodiment, as illustrated in FIG. 2, a thickness tc of the copper bonding layer 32 is set to be in a range of 0.05 mm to 5.0 mm.

The metal layer 13 (high alloy element concentration portion 13a) and the copper bonding layer 32 are bonded to each other and the copper bonding layer 32 and the heatsink 41 (skin layer 43) are bonded to each other by solid phase diffusion bonding.

Next, a method of manufacturing an insulating circuit board with a heatsink 40 according to the embodiment will be described with reference to FIGS. 4 to 7.

Figure 4:
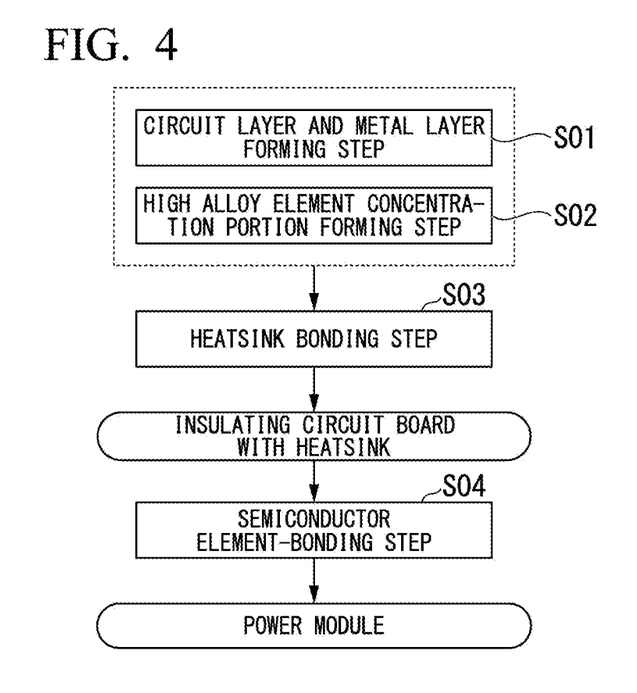
FIG. 4 is a flowchart illustrating the method of manufacturing an insulating circuit board with a heatsink according to the embodiment of the present invention.

(Circuit Layer and Metal Layer Forming Step S01/High Alloy Element Concentration Portion Forming Step S02)

First, as illustrated in FIG. 5, the aluminum sheets 22 and 23 are laminated on the first surface and the second surface of the ceramic substrate 11 via brazing materials 26 and 27. As the brazing materials 26 and 27, an Al—Si brazing material or an Al—Si—Mg brazing material is preferably used.

In addition, in the embodiment, the clad material 51 is laminated on the second surface side (in FIG. 5, the lower side) of the aluminum sheet 23 forming the metal layer 13.

Figure 6:
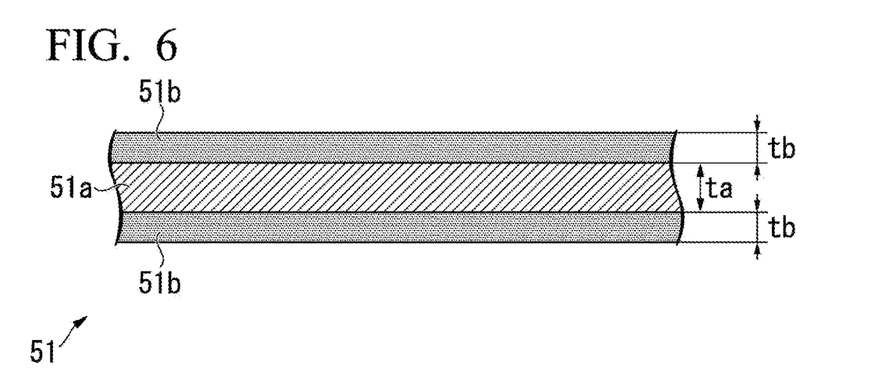
FIG. 6 is a cross-sectional view illustrating a clad material used in the method of manufacturing an insulating circuit board with a heatsink according to the embodiment of the present invention.

As illustrated in FIG. 6, the clad material 51 includes: a core material 51a and a brazing material layer 51b that is formed on both surfaces of the core material 51a. In the embodiment, the core material 51a is formed of an A3003 alloy, and the brazing material layer 51b is formed of an A4045 alloy.

In addition, a ratio tb/ta of a thickness to of the core material 51a and a thickness tb of the brazing material layer 51b in the clad material 51 is set to be in a range of 0.1 to 0.3.

In a state where the aluminum sheet 22, the ceramic substrate 11, the aluminum sheet 23, and the clad material 51 are pressurized in a laminating direction, the laminate is heated. As a result, the ceramic substrate 11 and the aluminum sheets 22 and 23 are bonded to each other to form the circuit layer 12 and the metal layer 13, and the alloy elements of the brazing material layer 51b of the clad material 51 are diffused to the core material 51a and the aluminum sheet 23 side. Thus, the high alloy element concentration portion 13a having a higher alloy element concentration than the thickness center portion of the metal layer 13 and having a solidus temperature of 650° C. or lower is formed in the region of the metal layer 13 opposite to the ceramic substrate 11.

That is, in the embodiment, the circuit layer and metal layer forming step S01 and the high alloy element concentration portion forming step S02 are performed at once.

Bonding conditions in the circuit layer and metal layer forming step S01 and the high alloy element concentration portion forming step S02 are preferably set as follows: the atmosphere is a vacuum, the pressurization load is in a range of 0.1 MPa to 3.5 MPa, the heating temperature is in a range of 560° C. to 630° C., and the holding time is in a range of 15 min to 60 min. In order to control the diffused state of the alloy elements, it is preferable that the bonding temperature and the holding time are adjusted in the above-described range.

Through the above-described steps, the insulating circuit board 10 according to the embodiment is formed.

(Heatsink Bonding Step S03)

Next, as illustrated in FIG. 7, the heatsink 41 is laminated on the second surface side (in FIG. 7, the lower side) of the metal layer 13 where the high alloy element concentration portion 13a is formed via the copper sheet 52 as a copper bonding material formed of a rolled sheet of oxygen free copper. The heatsink 41 is laminated such that the skin layer 43 faces the copper sheet 52 side.

The insulating circuit board 10, the insulating circuit board 10 where the high alloy element concentration portion 13a is formed, the copper sheet 52, and the heatsink 41 are pressurized in the laminating direction and heated. As a result, the high alloy element concentration portion 13a of the metal layer 13 and the copper sheet 52 are bonded to each other and the copper sheet 52 and the heatsink 41 (skin layer 43) are bonded to each other by solid phase diffusion bonding.

In the embodiment, as solid phase diffusion conditions, the load in the laminating direction is set to be in a range of 0.6 MPa to 3.5 MPa. The bonding temperature is in a range of 460° C. to 540° C. and preferably in a range of 480° C. to 520° C. The holding time is in a range of 30 min to 240 min.

Through the above-described steps, the insulating circuit board with a heatsink 40 according to the embodiment is manufactured.

(Semiconductor Element-Bonding Step S04)

Next, the semiconductor element 3 is laminated on the circuit layer 12 of the insulating circuit board with a heatsink 40 via a solder material, and the circuit layer 12 of the insulating circuit board with a heatsink 40 and the semiconductor element 3 are bonded to each other in a reducing furnace.

The power module 1 illustrated in FIG. 1 is manufactured as described above.

The method of manufacturing the insulating circuit board with a heatsink 40 according to the embodiment having the above-described configuration includes: the high alloy element concentration portion forming step S02 of forming the high alloy element concentration portion 13a having a higher alloy element concentration than the thickness center portion of the metal layer 13 and having a solidus temperature of 650° C. or lower in the region of the metal layer 13 opposite to the ceramic substrate 11; and the heatsink bonding step S03 of bonding the heatsink 41 to the metal layer 13 by laminating the copper sheet 52 formed of copper or a copper alloy between the high alloy element concentration portion 13a of the metal layer 13 and a bonding surface (in the embodiment, the skin layer 43) of the heatsink 41 and bonding the high alloy element concentration portion 13a of the metal layer 13 and the copper sheet 52 to each other and bonding the copper sheet 52 and the heatsink 41 to each other by solid phase diffusion bonding. Therefore, a temperature difference between the solidus temperature of the high alloy element concentration portion 13a of the metal layer 13 and the solidus temperature of aluminum or the aluminum alloy forming the bonding surface (in the embodiment, the skin layer 43) of the heatsink 41 can be reduced, even when solid phase diffusion bonding is performed under a relatively low-temperature condition, Al of the high alloy element concentration portion 13a of the metal layer 13 and Cu of the copper sheet 52 can be sufficiently diffused, Cu of the copper sheet 52 and Al of the bonding surface of the heatsink 41 can be sufficiently diffused, and the insulating circuit board 10 and the heatsink 41 can be reliably bonded to each other.

In addition, in the insulating circuit board with a heatsink 40 according to the embodiment, the metal layer 13 is formed of aluminum (in the embodiment, 4N aluminum), and the indentation hardness in the thickness center portion of the metal layer 13 is lower than 50 mgf/μm$^2$. Therefore, during loading of a thermal cycle on the insulating circuit board with a heatsink 40, a thermal strain can be released by deforming the metal layer 13, and the cracking or the like of the ceramic substrate 11 can be suppressed.

In addition, the heatsink 41 is formed of an Al—SiC composite material (so-called AlSiC) of a porous body formed of SiC and an aluminum material formed of an aluminum alloy impregnated into the porous body. Specifically, as the aluminum material impregnated into the porous body formed of SiC, ADC12 (solidus temperature: 570° C.) is used. Therefore, the thermal expansion coefficient of the heatsink 41 is close to the thermal expansion coefficient of the insulating circuit board 10, and the occurrence of a thermal strain during loading of a thermal cycle can be suppressed.

In addition, in the embodiment, in the high alloy element concentration portion forming step S02, the high alloy element concentration portion 13a is formed by laminating the clad material 51 including the core material 51a and the brazing material layer 51b formed on both surfaces of the core material Ma on the surface of the metal layer 13 opposite to the ceramic substrate 11 to obtain a laminate and heating the laminate to diffuse the alloy element of the brazing material layer 51b. Thus, the high alloy element concentration portion 13a having a higher alloy element concentration than the thickness center portion of the metal layer 13 and having a solidus temperature of 650° C. or lower can be reliably formed in the region of the metal layer 13 opposite to the ceramic substrate 11.

Further, in the embodiment, the ratio tb/ta of the thickness tb of the brazing material layer 51b to the thickness to of the core material 51a in the clad material 51 used in the high alloy element concentration portion forming step S02 is set to be in a range of 0.1 to 0.3. Thus, the high alloy element concentration portion 13a having a higher alloy element concentration than the thickness center portion of the metal layer 13 and having a solidus temperature of 650° C. or lower can be reliably formed in the region of the metal layer 13 opposite to the ceramic substrate 11.

In addition, in the embodiment, a temperature difference between the solidus temperature of the high alloy element concentration portion 13a of the metal layer 13 and the solidus temperature of the aluminum alloy forming the bonding surface (in the embodiment, the skin layer 43) of the heatsink 41 is in a range of 0° C. to 80° C. Therefore, in the heatsink bonding step S03, even when solid phase diffusion bonding is performed under a relatively low-temperature condition, Al of the metal layer 13 (high alloy element concentration portion 13a) and Cu of the copper sheet 52 can be sufficiently diffused, Cu of the copper sheet 52 and Al of the bonding surface of the heatsink 41 can be sufficiently diffused, and the insulating circuit board 10 and the heatsink 41 can be reliably bonded to each other by solid phase diffusion bonding.

Hereinabove, the embodiment of the present invention has been described. However, the present invention is not limited to the embodiment, and various modifications can be made within a range not departing from the technical ideas of the present invention.

For example, in the description of the embodiment, aluminum nitride (AlN) is used as the ceramic substrate 11, but the present invention is not limited thereto. The ceramic substrate 11 may be formed of another ceramic such as alumina ($Al_2O_3$) or silicon nitride ($Si_3N_4$). In addition, for example, an insulating resin may be used.

In addition, in the description, a radiating sheet is used as the heatsink, but the present invention is not limited thereto. For example, the heatsink may be a cooler including a passage through which a cooling medium passes.

Further, in the description of the embodiment, the heatsink is formed of an Al—SiC composite material (so-called AlSiC) in which an aluminum material formed of ADC12 impregnated into a porous body formed of SiC, but the present invention is not limited thereto. The material or structure of the bonding surface of the heatsink is not limited as long as the bonding surface of the heatsink is formed of an aluminum alloy having a solidus temperature of 650° C. or lower.

Further, in the description of the embodiment, the circuit layer is formed of aluminum or an aluminum alloy, but the present invention is not limited thereto. The circuit layer may be formed of another metal such as copper or a copper alloy, or may have a structure in which an aluminum layer formed of aluminum or an aluminum alloy and a copper layer formed of copper or a copper alloy are laminated.

In the description of the embodiment, the high alloy element concentration portion is formed by laminating the clad material on the metal layer and heating the laminate. However, the means of the high alloy element concentration portion forming step is not particularly limited.

Figure 8:
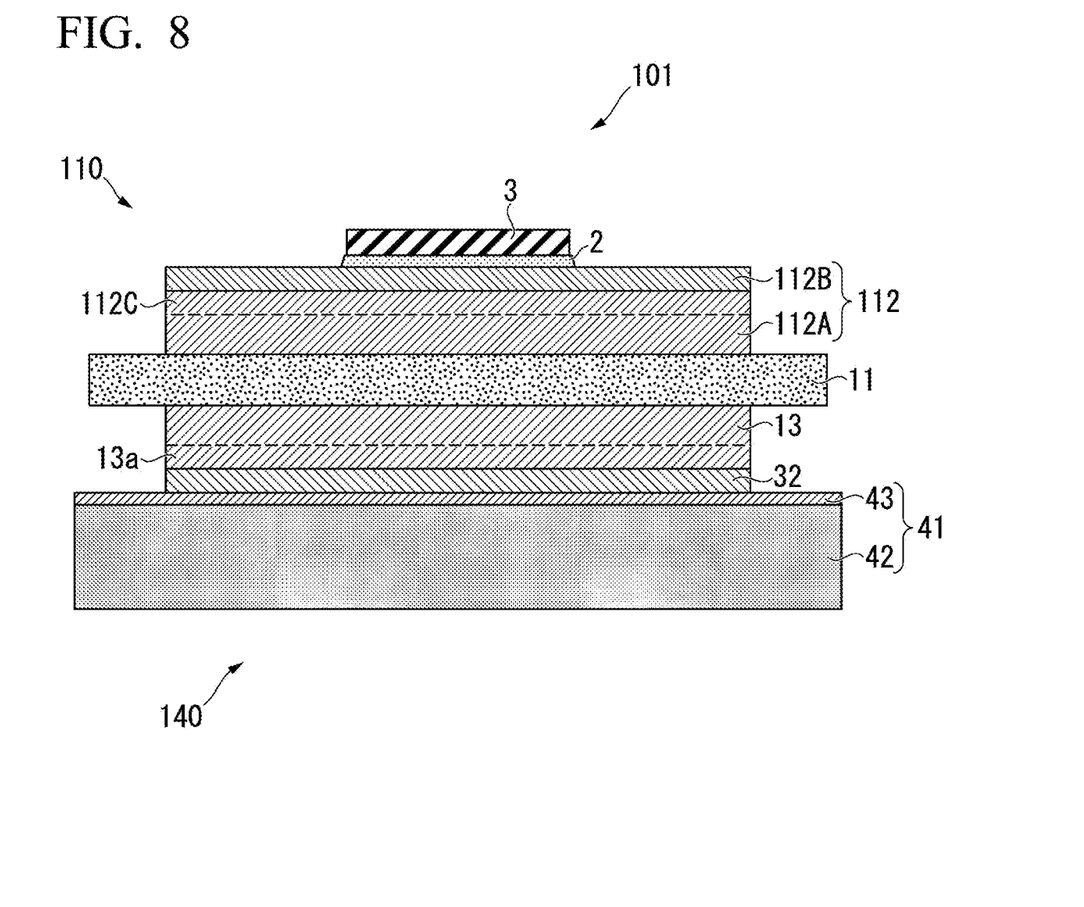
FIG. 8 is a schematic diagram illustrating a power module including an insulating circuit board with a heatsink that is manufactured using a method of manufacturing an insulating circuit board with a heatsink according to another embodiment of the present invention.

In addition, as illustrated in FIG. 8, an insulating circuit board 110 or an insulating circuit board with a heatsink 140 may be configured in which the circuit layer 112 includes an aluminum layer 112A that is formed on the ceramic substrate 11 side as the insulating layer side and a copper layer 112B that is laminated on the aluminum layer 112A, and a second high alloy element concentration portion 112C having a higher alloy element concentration than a thickness center portion of the aluminum layer 112A and a solidus temperature of 650° C. or lower is formed in a region of the aluminum layer 112A opposite to the ceramic substrate 11.

The insulating circuit board with a heatsink 140 also includes the metal layer 13, the aluminum bonding layer 31, the copper bonding layer 32, and the heatsink 41.

The insulating circuit board with a heatsink 140 illustrated in FIG. 8 is manufactured as follows.

Figure 9:
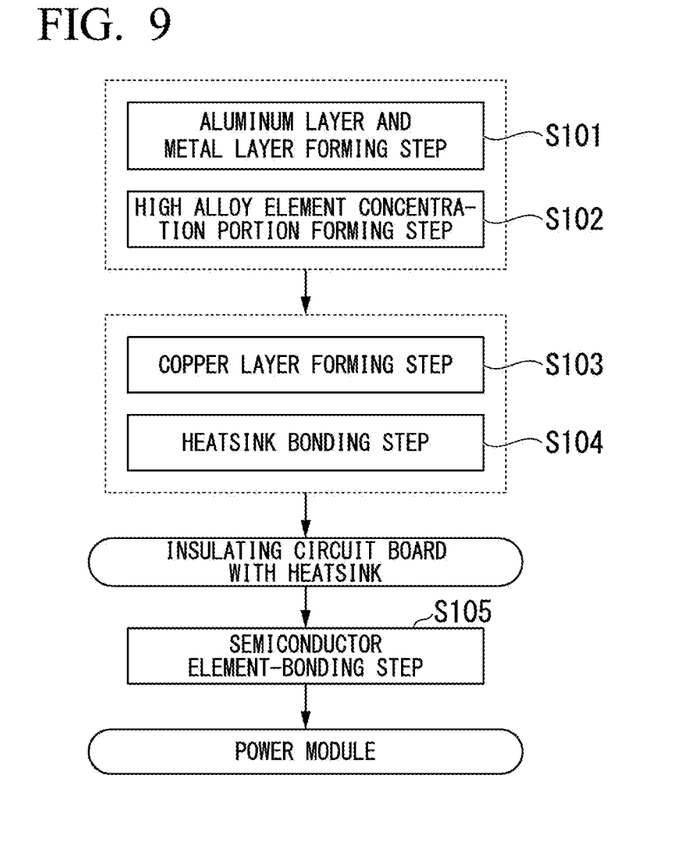
FIG. 9 is a flowchart illustrating the method of manufacturing an insulating circuit board with a heatsink illustrated in FIG. 8.
Figure 10:
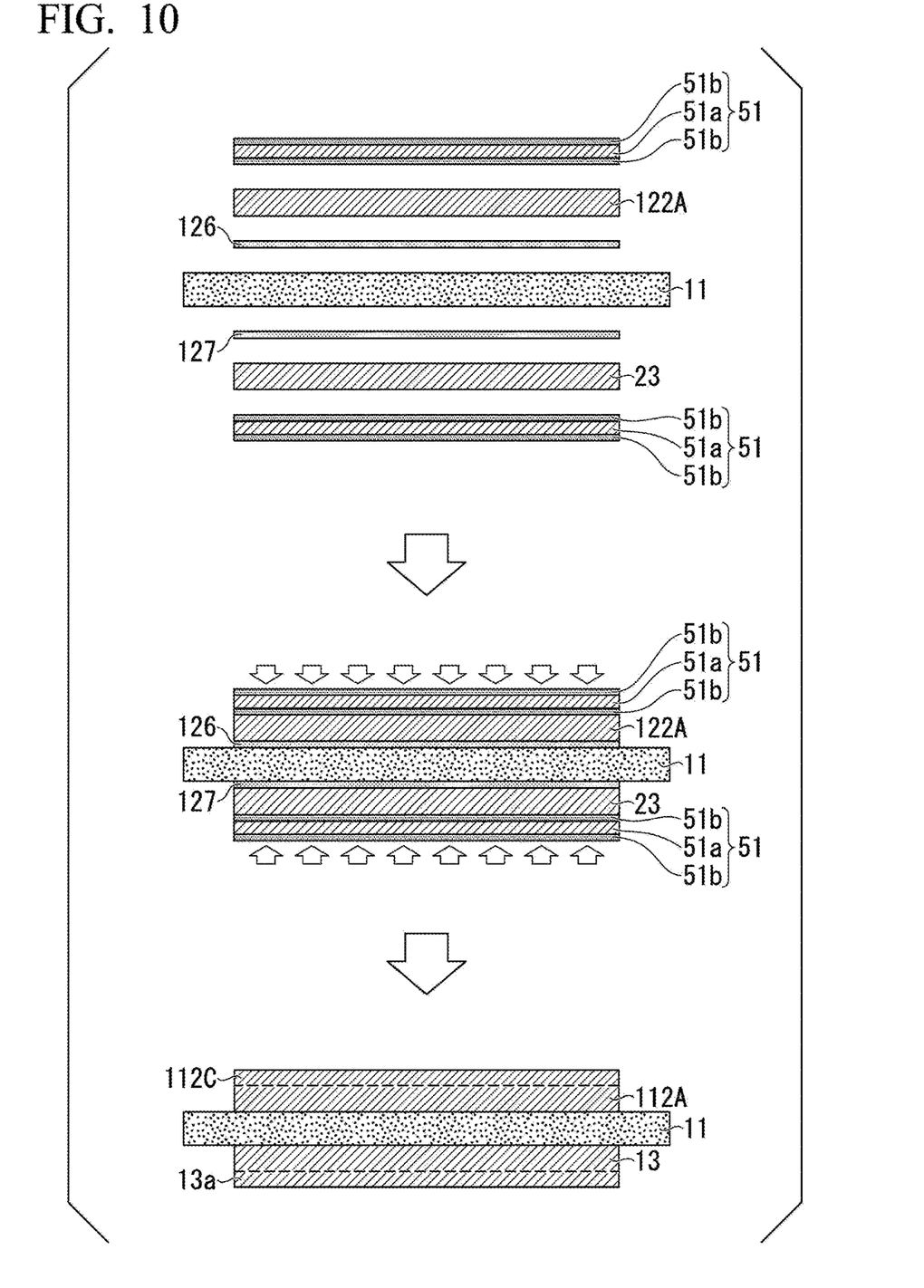
FIG. 10 is a diagram illustrating the method of manufacturing an insulating circuit board with a heatsink illustrated in FIG. 8.

(Aluminum Layer And Metal Layer Forming Step S101/ High Alloy Element Concentration Portion Forming Step S102) First, as illustrated in FIG. 10, an aluminum sheet 122A that is an aluminum layer is laminated on the first surface (in FIG. 10, the upper surface) of the ceramic substrate 11 via a brazing material 126, and the clad material 51 is laminated on a first surface of the aluminum sheet 122A.

Further, the aluminum sheet 23 that is the metal layer 13 is laminated on the second surface (in FIG. 10, the lower surface) of the ceramic substrate 11 via a brazing material 127, and the clad material 51 is laminated on the second surface of the aluminum sheet 23.

The aluminum sheet 122A that is the aluminum layer 112A and the aluminum sheet 23 that is the metal layer 13 are formed of, for example, aluminum (4N aluminum) having a purity of 99.99 mass % or higher or aluminum (2N aluminum) having a purity of 99 mass % or higher.

In addition, the brazing materials 126 and 127 are formed of an Al—Si—Mg alloy.

In a state where the clad material 51, the aluminum sheet 122A, the brazing material 126, the ceramic substrate 11, the brazing material 127, the aluminum sheet 23, and the clad material 51 are pressurized in a laminating direction, the laminate is heated. As a result, the ceramic substrate 11 and the aluminum sheets 122A and 23 are bonded to each other to form the aluminum layer 112A and the metal layer 13.

Further, the alloy elements of the brazing material layer 51b of the clad material 51 are diffused to the core material 51a and the aluminum sheet 122A side. Thus, the second high alloy element concentration portion 112C having a higher alloy element concentration than the thickness center portion of the aluminum layer 112A and having a solidus temperature of 650° C. or lower is formed in a region of the aluminum layer 112A opposite to the ceramic substrate 11.

In addition, the alloy elements of the brazing material layer 51b of the clad material 51 are diffused to the core material 51a and the aluminum sheet 23 side. Thus, the high alloy element concentration portion 13a having a higher alloy element concentration than the thickness center portion of the metal layer 13 and having a solidus temperature of 650° C. or lower is formed in the region of the metal layer 13 opposite to the ceramic substrate 11.

Bonding conditions are preferably set as follows: the atmosphere is a vacuum, the pressurization load is in a range of 0.1 MPa to 3.5 MPa, and the heating temperature is in a range of 600° C. to 640° C.

(Copper Layer Forming Step S103/Heatsink Bonding Step S104)

Figure 11:
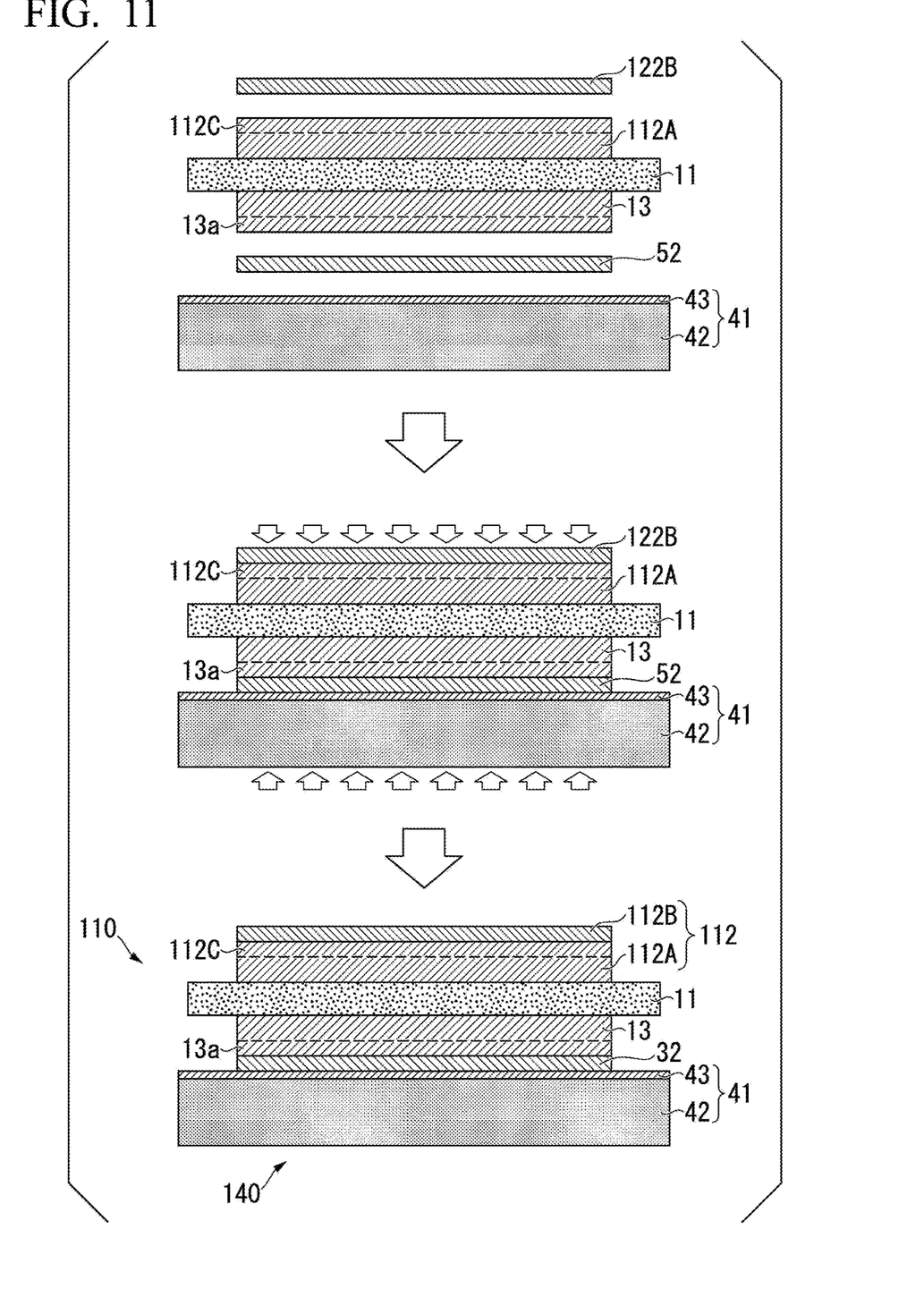
FIG. 11 is a diagram illustrating the method of manufacturing an insulating circuit board with a heatsink illustrated in FIG. 8.

Next, as illustrated in FIG. 11, the copper sheet 122B that is the copper layer 112B is laminated on the first surface (in FIG. 11, the upper side) of the aluminum layer 112A where the second high alloy element concentration portion 112C is formed. In addition, the heatsink 41 is laminated on the second surface side (in FIG. 11, the lower side) of the metal layer 13 where the high alloy element concentration portion 13a is formed via the copper sheet 52 as a copper bonding material formed of a rolled sheet of oxygen free copper. The heatsink 41 is laminated to form a laminate such that the skin layer 43 faces the copper sheet 52 side.

The laminate is pressurized in the laminating direction and heated such that the aluminum layer 112A (the second high alloy element concentration portion 112C) and the copper sheet 122B are bonded to each other, the metal layer 13 (the high alloy element concentration portion 13a) and the copper sheet 52 are bonded to each other, and the copper sheet 52 and the heatsink 41 (the skin layer 43) are bonded to each other by solid phase diffusion bonding. In the embodiment, as solid phase diffusion conditions, the load in the laminating direction is set to be in a range of 0.6 MPa to 3.5 MPa. The bonding temperature is in a range of 460° C. to 540° C. and preferably in a range of 480° C. to 520° C. The holding time is preferably in a range of 30 min to 240 min.

Through the above-described steps, the insulating circuit board with a heatsink 140 illustrated in FIG. 8 is manufactured.

EXAMPLES

Hereinafter, an experiment for verifying the effectiveness of the present invention will be described.

A circuit layer (37 mm×37 mm×thickness 0.4 mm) formed of aluminum (4N aluminum) having a purity of 99.99 mass % was formed on a first surface of a ceramic substrate (40 mm×40 mm×thickness 0.635 mm) formed of aluminum nitride (AlN). A metal layer (37 mm×37 mm) formed of a material shown in Table 1 and having a thickness shown in Table 1 was formed on a second surface of the ceramic substrate. The ceramic substrate and the aluminum sheet as the circuit layer and the metal layer were bonded to each other using an Al-7.5 mass % Si-0.01 mass % Mg brazing material foil (thickness: 15 μm).

In addition, a clad material having a structure shown in Table 1 was laminated on a surface of the aluminum sheet as the metal layer opposite to the ceramic substrate.

The laminate was heated under conditions shown in Table 1.

A heatsink (50 mm×60 mm×thickness 5.0 mm/thickness of skin layer: 0.1 mm) formed of an Al—SiC composite material (so-called AlSiC) in which aluminum having a solidus temperature shown in Table 1 was impregnated into a porous body of SiC was laminated on the metal layer via a copper bonding material (rolled sheet of oxygen free copper: 37 mm×37 mm×thickness 1.0 mm). This laminate was pressurized in a laminating direction at 21 MPa and was held at 490° C. for 150 min such that the metal layer where the high alloy element concentration portion was formed and the copper bonding material were bonded to each other and the copper bonding material and the heatsink were bonded to each other by solid phase diffusion bonding.

When the material of the heatsink in Table 2 was 4N—Al, an aluminum sheet (50 mm×60 mm×thickness 5.0 mm) having a purity of 99.99 mass % or higher (4N—Al) was used.

The obtained insulating circuit board with a heatsink was evaluated for the respective items in the following order.

(Measurement of Indentation Hardness)

The indentation hardness of the metal layer of the insulating circuit board with a heatsink was measured using a nanoindentation method. The measurement was performed at 10 positions of the center of the metal layer in the thickness direction to obtain the average value. In order to measure the indentation hardness, a load-displacement relation was measured when a negative pressure was applied at a test load of 5000 mgf using a triangular pyramidal diamond indenter called a Berkovich indenter having a dihedral angle of 114.8° to 115.1°. The indentation hardness was obtained from the expression Indentation Hardness=$37.926 \times 10^{-3}$ (load [mgf]÷displacement [μm]$^2$).

(Presence or Absence of High Alloy Element Concentration Portion)

A cross-section was observed in the thickness direction, and quantitative analysis by EPMA was performed using an electron probe microanalyzer (JXA-8800RL manufactured by JEOL Ltd.) under conditions of acceleration voltage: 1.5 kV, probe diameter: 50 μm, and irradiation current: $5.0 \times 10^{-8}$ A to check whether or not a high alloy element concentration portion having a higher alloy element concentration than a thickness center portion of the metal layer and having a solidus temperature of 650° C. or lower was present.

(Bonding State)

An ultrasonic-detected image of a interface between the copper bonding material and a member formed of aluminum having a higher solidus temperature among the aluminum (in the case of AlSiC, the impregnated aluminum) forming the heatsink and the aluminum forming the aluminum bonding layer was measured using an ultrasonic flaw detector (Fine Sat 200, manufactured by Hitachi Power Solutions Co., Ltd.), and a bonding rate was calculated from the following expression.

An initial bonding area refers to the area to be bonded before bonding, that is, the area of the copper bonding material.

(Bonding Rate)=((Initial Bonding Area)−(Exfoliation Area))/(Initial Bonding Area)

In an image obtained by binarizing the ultrasonic-detected image, exfoliation is represented by a white portion in the bonding layer. Therefore, the area of the white portion was set as the exfoliation area.

A case where the bonding rate was 90% or higher was evaluated as "o", and a case where the bonding rate was lower than 90% was evaluated as "x".

(Ceramic Cracking)

3000 thermal cycles of −40° C.←→150° C. were performed on the insulating circuit board with a heatsink, and the ceramic substrate was observed using an ultrasonic flaw detector after the thermal cycles. A case where cracking did not occur was evaluated as "o", and a case where cracking occurred was evaluated as "x".

TABLE 1

| | | Metal Layer | | Clad Material | | | | Bonding Conditions | | |
| | | | | Core Material | | Brazing Material Layer | | | | |
| 3 | Material | Indentation Hardness (mgf/μm$^2$) | Thickness t0 (mm) | Material | Thickness Ta(mm) | Material | Thickness tb (mm) | tb/ta | Pressurization Pressure (MPa) | Holding Temperature (° C.) | Holding Temperature (min) |
|---|---|---|---|---|---|---|---|---|---|---|---|
| Example 1 | 4N—Al | 35 | 0.60 | A3003 | 0.10 | Al—Si—Mg | 0.018 | 0.18 | 0.5 | 630 | 20 |
| Example 2 | 4N—Al | 42 | 0.40 | A3003 | 0.10 | Al—Si—Mg | 0.018 | 0.18 | 0.5 | 630 | 20 |
| Example 3 | 4N—Al | 43 | 0.40 | A3003 | 0.10 | A4343 | 0.018 | 0.18 | 0.5 | 630 | 20 |
| Example 4 | 4N—Al | 42 | 0.40 | A3003 | 0.10 | A4004 | 0.018 | 0.18 | 0.5 | 630 | 20 |
| Example 5 | 4N—Al | 45 | 0.40 | A3003 | 0.10 | A4005 | 0.018 | 0.18 | 0.5 | 630 | 20 |
| Example 6 | 4N—Al | 44 | 0.40 | A3003 | 0.05 | Al—Si—Mg | 0.010 | 0.20 | 0.5 | 630 | 20 |
| Comparative Example 1 | 4N—Al | 55 | 0.20 | A3003 | 0.10 | Al—Si—Mg | 0.018 | 0.18 | 0.5 | 630 | 20 |
| Comparative Example 2 | 4N—Al | 55 | 0.30 | A3003 | 0.10 | Al—Si—Mg | 0.018 | 0.18 | 0.5 | 630 | 20 |
| Comparative Example 3 | 4N—Al | 38 | 0.40 | A3003 | 0.20 | Al—Si—Mg | 0.018 | 0.09 | 0.5 | 630 | 20 |
| Comparative Example 4 | 4N—Al | 42 | 0.40 | — | — | Al—Si—Mg | 0.030 | — | 0.5 | 630 | 20 |
| Comparative Example 5 | 4N—Al | 42 | 0.40 | A3003 | 0.10 | Al—Si—Mg | 0.007 | 0.07 | 0.5 | 630 | 20 |
| Comparative Example 6 | 4N—Al | 60 | 0.40 | A3003 | 0.10 | A4145 | 0.015 | 0.15 | 0.5 | 630 | 20 |
| Comparative Example 7 | 4N—Al | 35 | 0.40 | — | — | — | — | — | 0.5 | 630 | 20 |

*Al—Si—Mg: Al-10.5 mass % Si-1.5 mass % Mg

TABLE 2

| | High Alloy Element Concentration Portion | Heatsink Material | Heatsink Solidus Temperature (° C.) | Evaluation Bonding State | Evaluation Cracking of Ceramic Substrate |
|---|---|---|---|---|---|
| Example 1 | Present | ADC12 | 570 | ○ | ○ |
| Example 2 | Present | ADC12 | 570 | ○ | ○ |
| Example 3 | Present | ADC12 | 570 | ○ | ○ |
| Example 4 | Present | ADC12 | 570 | ○ | ○ |
| Example 5 | Present | ADC12 | 570 | ○ | ○ |
| Example 6 | Present | ADC12 | 570 | ○ | ○ |
| Comparative Example 1 | Present | ADC12 | 570 | ○ | x |
| Comparative Example 2 | Present | ADC12 | 570 | ○ | x |
| Comparative Example 3 | Present | ADC12 | 570 | x | ○ |
| Comparative Example 4 | Present | ADC12 | 570 | x | ○ |
| Comparative Example 5 | Present | ADC12 | 570 | x | ○ |
| Comparative Example 6 | Present | ADC12 | 570 | ○ | x |
| Comparative Example 7 | Absent | ADC12 | 570 | x | ○ |

In Comparative Examples 1, 2, and 6 in which the indentation hardness of the metal layer was 50 mgf/μm² or higher, ceramic cracking was observed after loading of a thermal cycle. It is presumed that, since the metal layer was relatively hard, the metal layer was not easily deformed during loading of a thermal cycle and a thermal strain was not able to be relaxed.

In Comparative Examples 3 and 5 in which the ratio tb/ta of the thickness tb of the brazing material layer to the thickness to of the core material in the clad material was lower than 0.1, the bonding rate was lower than 90%, and the bonding state was insufficient. In Comparative Example 4 in which the core material was not used in the clad material, the bonding rate was lower than 90%, and the bonding state was insufficient.

In Comparative Example 7 in which the clad material was not used and the high alloy element concentration portion was not formed, the bonding rate was lower than 90%, and the bonding state was insufficient.

On the other hand, in Examples 1 to 6 in which the indentation hardness of the metal layer was lower than 50 mgf/μm² and the ratio tb/ta of the thickness tb of the brazing material layer to the thickness to of the core material in the clad material was in a range of 0.1 to 0.3, the bonding rate was 90% or higher, and the bonding state was insufficient. In addition, ceramic cracking was not observed after loading of a thermal cycle. It is presumed that, since the metal layer was relatively soft, the metal layer was easily deformed during loading of a thermal cycle and a thermal strain was able to be relaxed.

As described above, it was found that the present invention can provide a method of manufacturing an insulating circuit board with a heatsink in which a metal layer and a heatsink can be reliably bonded to each other by solid phase diffusion bonding even when the metal layer is formed of aluminum having a relatively low deformation resistance and a bonding surface of the heatsink is formed of an aluminum alloy having a relatively low solidus temperature.

INDUSTRIAL APPLICABILITY

The present invention can provide a method of manufacturing an insulating circuit board with a heatsink in which a metal layer and a heatsink can be reliably bonded to each other by solid phase diffusion bonding even when the metal layer is formed of aluminum having a relatively low deformation resistance and a bonding surface of the heatsink is formed of an aluminum alloy having a relatively low solidus temperature.

REFERENCE SIGNS LIST

10 Insulating circuit board
11 CERAMIC substrate (insulating layer)
12 Circuit layer
13 Metal layer
13a: High alloy element concentration portion
32 Copper bonding layer
40 Insulating circuit board with heatsink
41 Heatsink
43 Skin layer (bonding surface)
51 Clad material
51a core material
51b brazing material layer
52: Copper sheet (copper bonding material)

What is claimed is:

1. A method of manufacturing an insulating circuit board with a heatsink including:
the insulating circuit board and the heatsink,
the insulating circuit board including a circuit layer that is formed on a first surface of an insulating layer and a metal layer that is formed on a second surface of the insulating layer,
the heatsink being bonded to the metal layer side of the insulating circuit board,
the metal layer being formed of aluminum and having a configuration in which an indentation hardness of a thickness center portion is lower than 50 mgf/μm²,
a bonding surface of the heatsink with the insulating circuit board being formed of an aluminum alloy having a solidus temperature of 650° C. or lower, and
the method comprising:
a high alloy element concentration portion forming step of forming a high alloy element concentration portion having a higher alloy element concentration than the thickness center portion of the metal layer and having a solidus temperature of 650° C. or lower by laminating a clad material including a core material and a brazing material layer formed on both surfaces of the core material on a region of the metal layer opposite to the insulating layer to obtain a laminate and heating the laminate to diffuse an alloy element of the brazing material layer; and a heatsink bonding step of bonding the heatsink to the metal layer by laminating a copper bonding material formed of copper or a copper alloy between the metal layer and a bonding surface of the heatsink and bonding the metal layer and the copper bonding material to each other and bonding the copper bonding material and the heatsink to each other by solid phase diffusion bonding, wherein a ratio tb/ta of a thickness tb of the brazing material layer to a thickness to of the core material in the clad material is in a range of 0.1 to 0.3.

2. The method of manufacturing the insulating circuit board with the heatsink according to claim 1, wherein in the high alloy element concentration portion, a Si concentration is in a range of 2.0 mass % to 7.0 mass %, and an Mn concentration is in a range of 1.0 mass % to 1.5 mass %.

3. The method of manufacturing the insulating circuit board with the heatsink according to claim 1, wherein the high alloy element concentration portion forming step is performed at the same time as a metal layer forming step of forming the metal layer on the insulating layer.

4. The method of manufacturing the insulating circuit board with the heatsink according to claim 1, wherein the circuit layer includes an aluminum layer that is formed on the insulating layer side and a copper layer that is laminated on the aluminum layer, a second high alloy element concentration portion having a higher alloy element concentration than a thickness center portion of the aluminum layer and a solidus temperature of 650° C. or lower is formed in a region of the aluminum layer opposite to the insulating layer, and the high alloy element concentration portion and the second high alloy element concentration portion are formed in the high alloy element concentration portion forming step.

5. The method of manufacturing the insulating circuit board with the heatsink according to claim 2, wherein the high alloy element concentration portion forming step is performed at the same time as a metal layer forming step of forming the metal layer on the insulating layer.

6. The method of manufacturing the insulating circuit board with the heatsink according to claim 2, wherein the circuit layer includes an aluminum layer that is formed on the insulating layer side and a copper layer that is laminated on the aluminum layer, a second high alloy element concentration portion having a higher alloy element concentration than a thickness center portion of the aluminum layer and a solidus temperature of 650° C. or lower is formed in a region of the aluminum layer opposite to the insulating layer, and the high alloy element concentration portion and the second high alloy element concentration portion are formed in the high alloy element concentration portion forming step.

7. The method of manufacturing the insulating circuit board with the heatsink according to claim 3, wherein the circuit layer includes an aluminum layer that is formed on the insulating layer side and a copper layer that is laminated on the aluminum layer, a second high alloy element concentration portion having a higher alloy element concentration than a thickness center portion of the aluminum layer and a solidus temperature of 650° C. or lower is formed in a region of the aluminum layer opposite to the insulating layer, and the high alloy element concentration portion and the second high alloy element concentration portion are formed in the high alloy element concentration portion forming step.

8. The method of manufacturing the insulating circuit board with the heatsink according to claim 5, wherein the circuit layer includes an aluminum layer that is formed on the insulating layer side and a copper layer that is laminated on the aluminum layer, a second high alloy element concentration portion having a higher alloy element concentration than a thickness center portion of the aluminum layer and a solidus temperature of 650° C. or lower is formed in a region of the aluminum layer opposite to the insulating layer, and the high alloy element concentration portion and the second high alloy element concentration portion are formed in the high alloy element concentration portion forming step.

* * * * *